United States Patent [19]

Harper et al.

[11] Patent Number: 4,733,322

[45] Date of Patent: Mar. 22, 1988

[54] AC-DC TRANSFER STANDARD OVERLOAD PROTECTION CIRCUIT

[75] Inventors: Jerry Harper, West Caldwell; Archie J. Harrison, Jr., Mount Arlington, both of N.J.

[73] Assignee: Ballantine Laboratories, Inc., Boonton, N.J.

[21] Appl. No.: 22,541

[22] Filed: Mar. 3, 1987

Related U.S. Application Data

[63] Continuation of Ser. No. 728,845, Apr. 30, 1985, abandoned.

[51] Int. Cl.⁴ .............................................. H01H 5/04
[52] U.S. Cl. ........................................ 361/103; 361/91
[58] Field of Search ........................ 361/86, 88, 89, 91, 361/110, 103; 330/69, 148; 323/907, 909, 245; 219/485, 494

[56] References Cited

U.S. PATENT DOCUMENTS 4,063,301  12/1977  Lye ......................... 361/88
4,193,104   3/1980  Nercessian ............. 361/110 X
4,495,405   1/1985  Foster .................... 323/245 X

OTHER PUBLICATIONS

Model 1600A-MOD88 Instruction Manual by Ballantine Lab. Inc., May-1984.
BIFET Products by Texas Instruments, p. 3425.

Primary Examiner—A. D. Pellinen
Assistant Examiner—Derek S. Jennings
Attorney, Agent, or Firm—Davis Hoxie Faithfull & Hapgood

[57] ABSTRACT

An overload protection circuit for an AC-DC transfer standard employing a thermoelement comprising a heater element and a temperature sensor. A first differentiator provides an output that is a function of the voltage across the heater element. A second differentiator produces an output that is a function of the output of the first differentiator. Further including a circuit creating an overload signal provided, which is responsive to the outputs of the first and second differentiators.

15 Claims, 3 Drawing Figures

AC-DC TRANSFER STANDARD OVERLOAD PROTECTION CIRCUIT

This application is a continuation of application Ser. No. 728,845 filed Apr. 30, 1985, now abandoned.

BACKGROUND OF THE INVENTION

This invention generally relates to AC-DC transfer standards.

An AC-DC transfer standard provides a DC output voltage approximately equal to the true RMS value of a complex or sinusoidal AC signal (referred to hereinafter as an AC signal). In one type of transfer standard, the AC signal to be measured is applied to a heater element adjacent to or contacting a temperature sensor. One type of temperature sensor is a bimetallic junction thermocouple, which comprises two wires that are joined at both ends. According to the Seebeck effect, heating one junction will induce a current in the wires. The joule heating caused by the AC signal induces a voltage in the thermocouple, which voltage is proportional to the temperature difference between the bimetallic junction adjacent the heater element and the cold junction temperature.

The thermocouple voltage is nulled by adjustment of a potentiometer, which is adjusted to apply an equal and opposite voltage to that generated by the thermocouple. Then, without changing the potentiometer setting, an easily measured DC voltage is substituted for the AC signal. The DC voltage amplitude is increased until the voltage generated by the thermocouple is again equal and opposite to the voltage generated by the potentiometer, as previously adjusted for the AC signal. When this null condition is reached, the amplitude of the DC voltage is measured. This DC amplitude is equal to the RMS value of the AC signal.

As an alternative to a thermocouple, the temperature of the heater wire can also be sensed with a sensing wire having a high temperature coefficient of resistivity. Typically, the sensing wire is wrapped about and electrically insulated from the heater wire. The electrical resistance of the sensing wire is a measure of the temperature of the heater wire. (Further particulars concerning this type of sensing device can be found in application Ser. No. 580,450 entitled "Resistive Sensing Thermal Device for Current Measurement," inventor Fred. L. Katzmann, filed Feb. 15, 1984 and assigned to the same assignee as this application.)

The heater wire is normally made of material having a relatively high electrical resistance, such as nickel-chromium alloy or Evanohm ® (the latter being preferred) about 0.35 to 0.5 mils in diameter. Any current above approximately 7 milliamps through this typical heater wire will anneal the wire and change the DC reversal error, necessitating readjustment of the AC-DC transfer standard. (DC reversal error is discussed in a co-pending patent application entitled "AC-DC Transfer Standard Temperature Sensor Reversal Error Compensation Circuit," U.S. Ser. No. 728,886, filed Apr. 30, 1987, and assigned to the assignee of this application. The contents of that application are incorporated herein by reference.) Additionally, any current greater than approximately 15 milliamps may destroy the heater wire. Thus there is a need for heater wire overload protection.

In one type of known overload protection scheme, the voltage applied to a heater wire is monitored by a bipolar peak-sensing overload protection circuit. Specifically, the gate of a field effect transistor is connected to the heater wire. When the peak voltage level across the heater wire exceeds a certain value, the conduction state of the field effect transistor changes, causing triggering of a silicon controlled rectifier, which causes a relay to disconnect the input voltage from the heater wire. With a typical circuit of this type, approximately one millisecond elapses from the start of the overload transient until the heater wire is disconnected from the applied voltage. The signal voltage must not rise more than 25 percent from its initial value during this disconnect time to avoid damage. Since this is a peak detection system, the proper AC peak voltage amplitude at which the conduction state of the field effect transistor should change may well be above that for a DC signal having an amplitude that can overload the heater element.

In another known overload protection scheme, an infrared sensor monitors the temperature of the heater wire. When an overload occurs, the current through the infrared sensor increases, triggering a silicon controlled rectifier. Due to the thermal inertia of the wire, the infrared overload protection sensor is not a peak detection sensor; additionally, the sensor makes no electrical contact with the heater wire, and therefore is not affected by the frequency or waveshape of the AC input to the heater wire. The reaction time of this infrared sensing circuit is typically on the order of 2 to 5 milliseconds. The drawback of using an infrared sensor is that a relatively large amount of current is needed to trigger the sensor. Thus lower currents, which can overload the heater wire, may not cause triggering of the overload circuit.

SUMMARY OF THE INVENTION

The present invention, an overload protection circuit, comprises a first differentiator responsive to the amplitude of the voltage across a heater element, and a second differentiator responsive to the output signal of the first differentiator. Means are provided for actuating an overload signal that is responsive to the output of the first and second differentiators.

DESCRIPTION OF THE PREFERRED EMBODIMENTS

Figure 1:
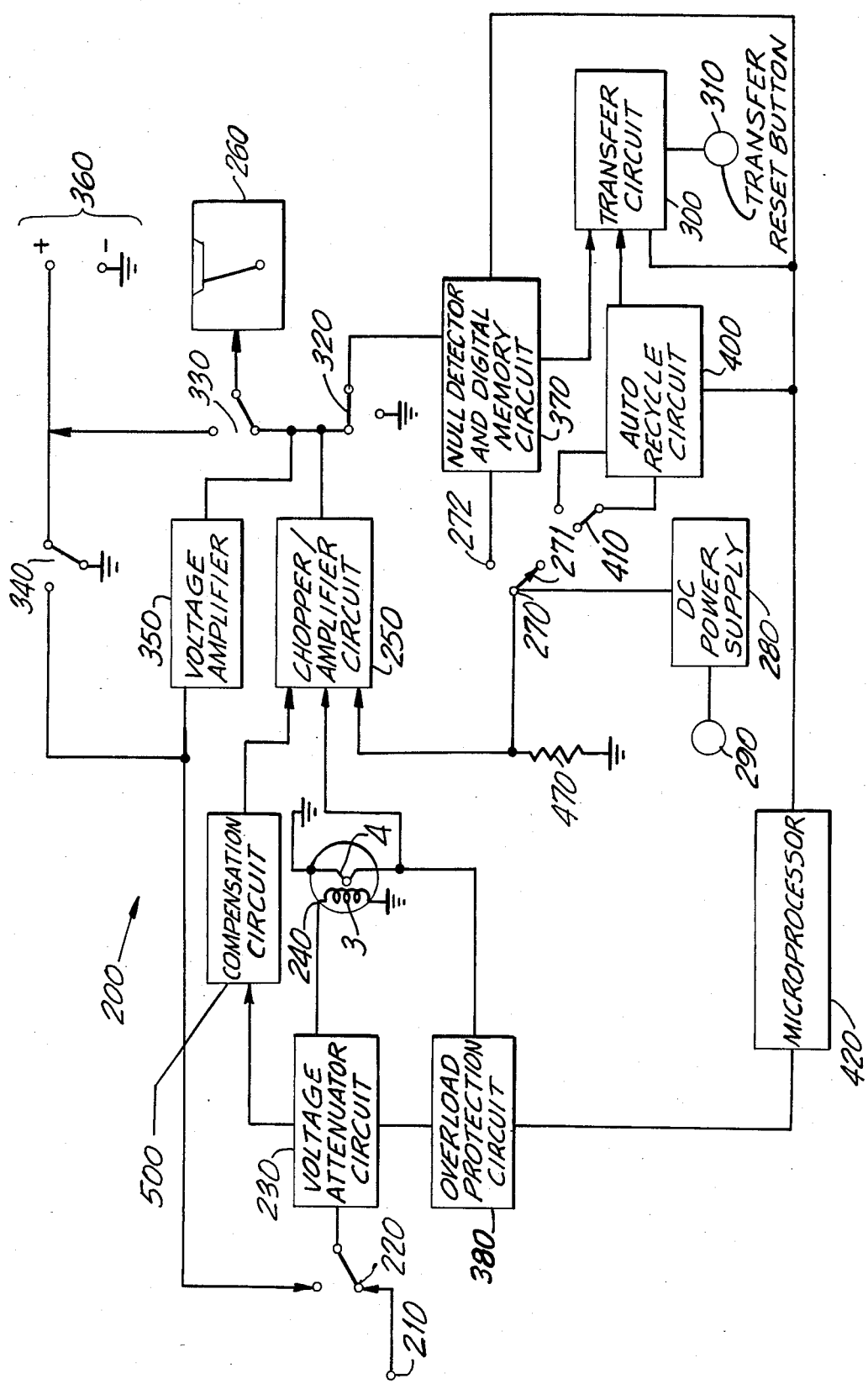
FIG. 1 is a block diagram of an AC-DC transfer standard.

FIG. 1 is a block diagram of an AC-DC transfer standard 200 of a type in which the present invention is utilized. Although this preferred embodiment uses a thermocouple, and not a sensing wire with a high temperature coefficient of resistivity to sense the temperature of the heater wire, this invention is applicable to transfer standards using either temperature sensor. Referring to FIG. 1, AC signals to be measured are applied to AC input connector 210, passed through switch 220 and into voltage attenuator circuit 230. Circuit 230 attenuates the voltage of the applied AC signal so that the voltage applied to the heater wire 3 of thermoelement 240 does not exceed a maximum allowable voltage. The attenuated AC signal passes through heater wire 3 of thermoelement 240, thereby causing the heater wire to heat up.

Thermocouple 4 of thermoelement 240 develops a DC output signal related to the RMS value of the attenuated AC input signal. This DC output signal is chopped and amplified in chopper/amplifier circuit 250. Chopping the DC signal eliminates the drift problems normally associated with the measurement of a low-level DC voltage, such as is produced by thermocouple 4.

The DC signal issued by thermoelement 240 can be either manually or automatically balanced by appropriate positioning of selector switch 270. FIG. 1 shows selector switch 270 set in manual balance mode position 271. In the manual balance mode, the operator varies the output of DC power supply 280 via knob 290 until its output balances the potential produced by thermocouple 4. At that point, the output of chopper/amplifier circuit is zero and balance meter 260 indicates that balance, or a null condition, has been achieved.

The operator next actuates transfer circuit 300 by pressing transfer reset button 310; this causes switches 220, 320, 330 and 340 to switch from their AC positions to their DC positions. After switching, no voltage is supplied to heater wire 3. In consequence, the output from thermocouple 4 immediately drops to zero. The voltage from DC power supply 280 then creates an error signal through chopper/amplifier circuit 250, since no balancing potential is produced by thermocouple 4. The error signal is amplified by amplifier 350, and then passes via switch 220 and voltage attenuator 230 to heater wire 3 of thermoelement 240.

The joule heating of heater wire 3 of thermoelement 240 causes a voltage to be developed in thermocouple 4. In consequence, the potential developed by thermocouple 4 and power supply 280 quickly balances and the output voltage of DC amplifier/chopper circuit 250 drops to zero (nulls). When the voltage drops to zero, the DC output of the voltage amplifier 350 is equal to the RMS value of the applied AC signal. That DC output voltage is available at binding posts 360.

In automatic operation, selector switch 270 is set in auto transfer/auto balance mode position 272. The DC output signal from thermocouple 4 is chopped and amplified in circuit 250 and fed via switch 320 to null detection and memory circuit 370. An appropriate memory circuit is disclosed in U.S. Pat. No. 3,518,525 to J. J. Duckworth et al., patented June 30, 1970, the contents of which are incorporated by reference in this disclosure. Null detection and digital memory circuit 370 automatically develops a DC balance voltage through a digital to analog converter, which balances the output of thermocouple 4 of thermoelement 240. At that time, amplifier/chopper circuit 250 has an output of zero volts and balance meter 260 indicates a null condition. Null detector and digital memory circuit 370 communicates the existence of a null condition to microprocessor 420, which in turn actuates transfer circuit 300, locking the DC balance voltage and causing switches 220, 320, 330 and 340 to switch from their AC to DC settings. Operation then proceeds as described above for manual balance.

Switch 410 can be actuated by the operator to activate auto recycle circuit 400. When activated, circuit 400 will, after DC balance has been achieved, automatically cause transfer circuit 300 to switch the transfer standard from the DC balance mode back to its AC mode, by moving switches 220, 320, 330 and 340 from their DC positions to their AC positions. Microprocessor 420 controls switching functions, as described above, and determines when transfer standard 200 should not be activated due to overload. Certain microprocessor functions with respect to overloads are discussed in greater detail below.

Compensation circuit 500 is included to compensate for DC reversal error arising from Thomson and Peltier effects. An appropriate thermocouple compensation circuit for an AC-DC transfer standard is disclosed in a co-pending application entitled "AC-DC Transfer Standard Temperature Sensor Reversal Error Compensation Circuit," U.S. Ser. No. 728,886, filed on Apr. 30, 1985, and assigned to the assignee of this application. FIG. 1 also shows overload protection circuit 380, which is depicted in greater detail in FIG. 2.

Figure 2A:
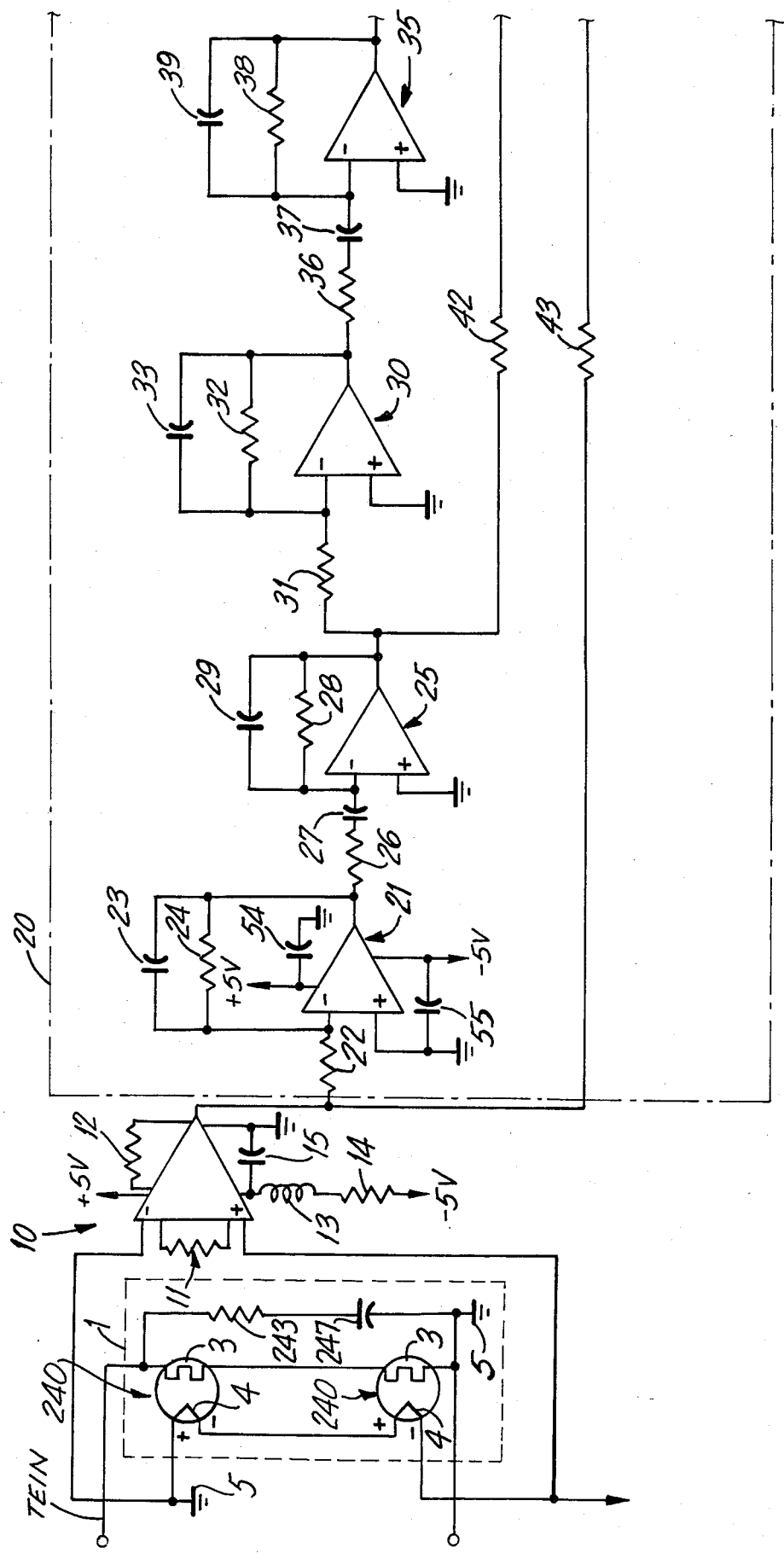
FIGS. 2A and 2B are a schematic of this invention and its associated components.
Figure 2B:
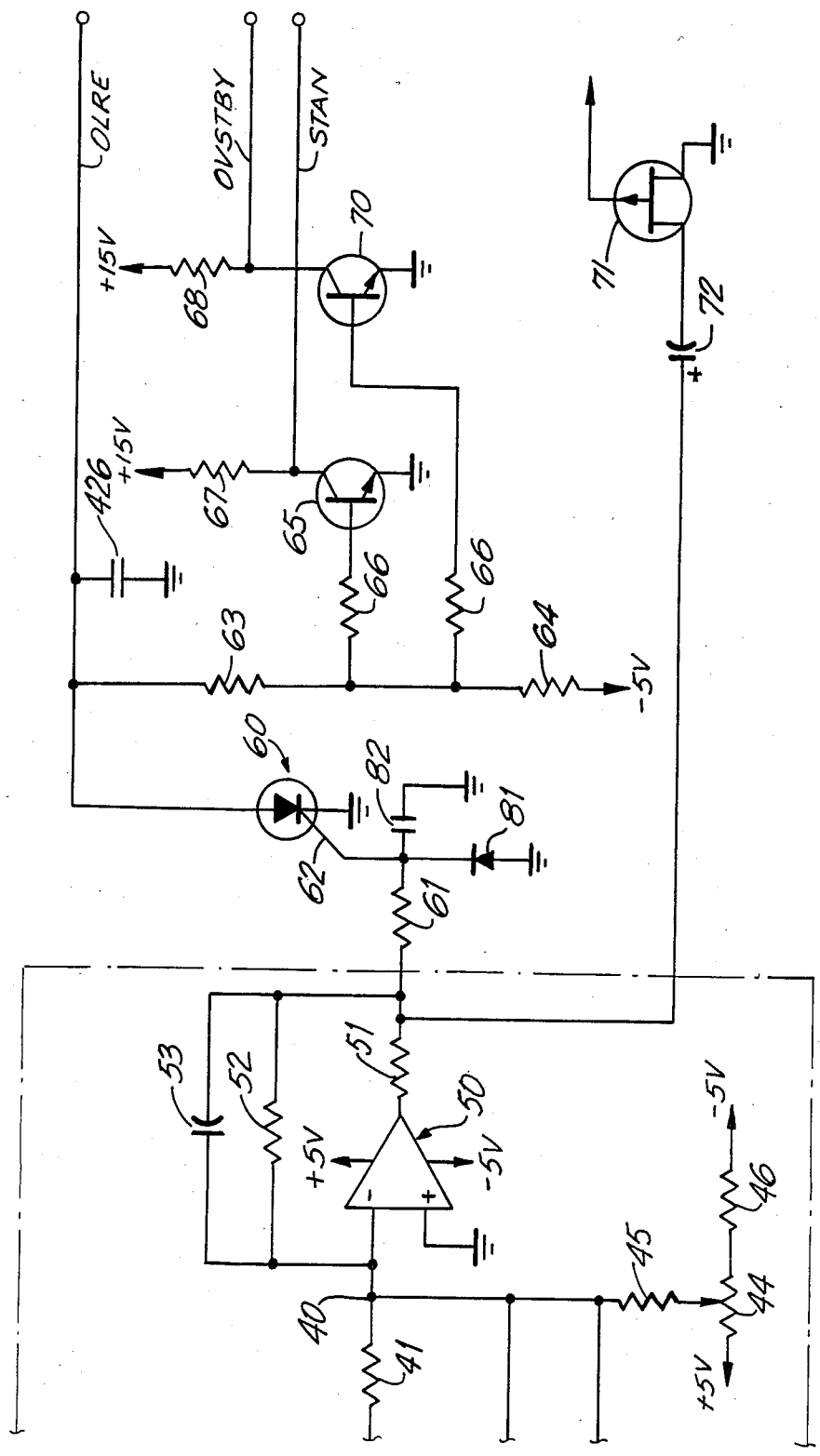

FIG. 2 shows dual thermoelement assembly 1. Dual thermoelement assembly 1 contains a first thermoelement 240 and a second thermoelement 240. Each thermoelement 240 contains a heater wire 3 and a thermocouple junction 4 enclosed in a vacuum or partial vacuum, with thermocouple junction 4 thermally contacting, but electrically insulated from, the center of heater wire 3. Two matched thermoelements are used rather than one to help minimize DC reversal error and yield a higher output voltage. The heater wires are connected in series and grounded at 5. A signal is input to the thermoelement heater wires 3 via line TEIN. The signal that is applied to line TEIN can be either the attenuated AC signal to be measured or the DC transfer voltage. Line TEIN is grounded through 196 ohm resistor 243 and 6.8 picofarad capacitor 247; this path to ground flattens the frequency response of the signal on line TEIN for signal frequencies of about 30-100 MHz.

Heater wires 3 cause potentials to be developed in thermocouples 4, the amplitude of those potentials being a function of the amplitude of the voltage drops across heater wires 3. It is possible to monitor for transients by measuring the potential across heater wires 3, or thermocouples 4. However, since measurement of the potential across heater wires 3 would rob power from wires 3, it is preferable to measure the signal developed by thermocouples 4.

The signal developed by thermocouples 4 is therefore fed to instrumentation amplifier 10, which functions as a buffer to remove common mode signals. Specifically, the positive input terminal of amplifier 10 is connected to the negative side of thermocouples 4 and the negative input terminal is connected to the positive, ground side of thermocouples 4.

In a presently preferred embodiment, amplifier 10 is a precision instrumentation amplifier, type number AD521, available from Analog Devices, Inc., Norwood, Mass., 02062. Using that amplifier in the preferred embodiment, pins 2 and 14 are connected via 8.25 kilohm resistor 11, pins 10 and 13 are connected via 100 kilohm resistor 12, pin 8 is connected to a plus 5 volt power source, pin 11 is grounded, and pin 5 is connected to a minus 5 volt power source via ferrite bead 13 in series with 31.6 ohm resistor 14. Pin 5 is also grounded via 0.1 microfarad capacitor 15. The output of amplifier 10 has a gain of about plus 12 relative to the input signal.

The output of balancing amplifier 12 is fed to overload protection rate sensing circuit 20. Circuit 20 is designed to anticipate with reasonable closeness the energy content of the voltage transient's rise so that the transient can be removed from heater wires 3 as quickly as possible. Overload protection rate sensing circuit 20 accomplishes this by taking the first and second derivative of the output signal of thermocouples 4, as altered by instrumentation amplifier 10. The first and second derivatives are used to generate a signal of relatively high amplitude either when the overvoltage transient is steeply rising or where the rate of change in rise is relatively large, either of which indicates an impending overload condition.

Specifically, the output of instrumentation amplifier 10 is fed to the negative input terminal of amplifier 21 through 10 kilohm resistor 22. The output of amplifier 21 is fed back to the negative input terminal via 100 picofarad capacitor 23 in parallel with 42.2 kilohm resistor 24. This feedback circuit produces a gain of about minus 4 through amplifier 21. The output of amplifier 21 is fed to the negative input terminal of amplifier 25 via 237 kilohm resistor 26 in series with 0.1 microfarad capacitor 27. The output of amplifier 25 is fed back to its negative input terminal via one megohm resistor 28 in parallel with 100 picofarad capacitor 29. This feedback circuit, in conjunction with amplifier 25, results in the output of amplifier 25 being the derivative of the signal input to its negative terminal.

The output of amplifier 25 is connected to the negative input terminal of amplifier 30 via 10 kilohm resistor 31. The output of amplifier 30 is fed back to its negative input terminal via 20 kilohm resistor 32 wired in parallel with 100 picofarad capacitor 33. This feedback circuit results in the output of amplifier 30 having a gain of about minus 2 relative to the input signal. The output of amplifier 30 is fed to the negative input terminal of amplifier 35 via 237 kilohm resistor 36 in series with 0.1 microfarad capacitor 37. As is the case with amplifier 25, the output of amplifier 35 is fed back to its negative input terminal via one megohm resistor 38 wired in parallel with 100 picofarad capacitor 39. This feedback circuit, in conjunction with amplifier 35, results in the output of amplifier 35 being the derivative of its input signal. Hence the output of amplifier 35 is the second derivative of the signal first delivered to overload protection rate sensing circuit 20.

The output of amplifier 35 is connected to node 40 via 75 kilohm resistor 41. The output of amplifier 25 is also connected to node 40 via 20 kilohm resistor 42. Thus the signal available at node 40 is a function of the first and second derivatives of the signal first applied to overload protection rate sensing circuit 20. Additionally, the input signal to overload protection rate sensing circuit 20 is also connected to node 40 via 33.2 kilohm resistor 43. This connection feeds a signal to node 40 that is related to the undifferentiated voltage output of the thermocouple. This connection therefore provides a DC signal path for slowly rising voltage transients that might not have a first or second derivative of relatively large amplitude.

Node 40 is connected to the adjustable contact of 50 kilohm variable resistor 44 via 750 kilohm resistor 45. One lead of resistor 44 is connected to a plus 5 volt voltage source; the other lead of resistor 44 is connected to a minus 5 volt voltage source via 38.3 kilohm resistor 46. By adjusting resistor 44, the point at which overload trip occurs can be varied. Typically, resistor 44 is set to cause overload trip when the current flowing through the thermocouples 4 is about 20 percent above the full scale operating point. In the embodiment shown in FIG. 2, the full scale operating point is about plus 11 millivolts.

Node 40 is connected to the negative input terminal of summing amplifier 50. The output of summing amplifier 50 is directed through 10 kilohm resistor 51 and then fed back to its negative input terminal via 178 kilohm resistor 52 wired in parallel with 100 picofarad capacitor 53. In the presently preferred embodiment, summing amplifier 50 consists of a low drift operational amplifier, number LM11, available from National Semiconductor, Santa Clara, Calif. Pin 4 of this amplifier is connected to a minus 5 volt power source, and pin 7 is connected to a plus 5 volt power source. The positive input terminal of this amplifier is grounded.

In the presently preferred embodiment, amplifiers 21, 25, 30 and 35 are contained on a JFET integrated circuit chip, type TL064, available from Texas Instruments, Inc., Dallas, Tex. Specifically, pin 2 serves as the negative input terminal and pin 1 as the output terminal of amplifier 21. Pin 4 is connected to a plus 5 volt power source and is also connected to ground via 0.1 microfarad capacitor 54. Pin 11 is connected to a minus 5 volt power source and is also grounded via 0.1 microfarad capacitor 55. Pin 6 serves as the input terminal and pin 7 the output terminal of amplifier 25. Pin 5, the positive terminal of amplifier 25, is grounded. Pin 9 serves as the negative input terminal and pin 8 the output of amplifier 30. Pin 10, the positive input terminal of amplifier 30, is grounded. Pin 13 is the negative input terminal and pin 14 the output of amplifier 35. Pin 12, the positive input terminal to amplifier 35, is grounded.

The output of summing amplifier 50 is connected to the gate 62 of silicon controlled rectifier 60 via resistor 51 and 10 kilohm resistor 61. The cathode of silicon controlled rectifier 60 is connected to ground. In the presently preferred embodiment, rectifier 60 is type 2N2323, available from the General Electric Company. The gate of silicon controlled rectifier 60 is also connected to ground via 0.1 microfarad capacitor 82, which provides filtering. The gate is additionally connected to the cathode of rectifier 81, the anode of which is grounded, to prevent the gate from experiencing a potential more negative than minus 0.7 volts.

When the voltage at gate 62 reaches a sufficiently high amplitude (in a presently preferred embodiment, that amplitude is about plus 0.4 volts), silicon controlled rectifier 60 is rendered conductive and the voltage on line OLRE, connected to the anode of silicon controlled rectifier 60, is pulled to the ground potential. Line OLRE is grounded via 0.47 microfarad capacitor 426.

Line OLRE is connected to a minus 5 volt power source via a voltage divider consisting of 1.1 kilohm resistor 63 and 4.64 kilohm resistor 64. The bases of transistors 65 and 70 are each connected to the common point between resistors 63 and 64 through a 4.64 kilohm resistor 66. The collector of transistor 65 is connected to a plus 15 volt power source via 3.16 kilohm resistor 67. The collector of transistor 70 is connected to a plus 15 volt power source via 46.4 kilohm resistor 68. The emitters of transistors 65 and 70 are both connected to ground. When gate 62 of silicon controlled rectifier 60 is fired and the voltage on OLRE is pulled approximately to the ground potential the collectors of transistors 65 and 70 are driven to a positive potential. These collectors are connected, via line STAN in the case of transistor 65 and line OVSTBY in the case of transistor 70, to microprocessor 420, shown in FIG. 1. Line STAN, when driven to a positive potential, shuts down DC amplifier 350, which in the DC operation mode removes high voltage from DC binding posts 360. Line OVSTBY, when driven to a positive potential, causes voltage attenuator 230 to disconnect heater wires 3 from the potentially damaging voltage transient and alerts microprocessor 420 that an overload has occurred.

In order to turn off the silicon controlled rectifier 60 and put the AC-DC transfer standard back in operation, microprocessor 420 disconnects line OLRE from its current source (not shown), which causes silicon controlled rectifier 60 to turn off. Microprocessor 420 then pulls OLRE back up to its initial potential, and operation can resume.

The output of summing amplifier 50 is also connected to the drain of field effect transistor 71 through resistor 51 and 1.5 microfarad capacitor 72. The source of field effect transistor 71 is connected to ground. When AC-DC transfer standard 100 is operating in its higher voltage ranges (above about 500 volts), the ratio of the maximum obtainable voltage during an overload transient to the operating voltage is much lower than when standard 100 is operating in its lower voltage ranges. Thus, in the higher voltage ranges, there is no need to anticipate high over-voltage ratios by sensing the overvoltage rise rate and acceleration. Indeed, doing so would cause unnecessary activation of the overload protection circuit; therefore, when transfer standard 100 is operating at higher voltages, the gate of 71 is activated, which filters out high frequency signals from reaching gate 62 of silicon controlled rectifier 60, thereby desensitizing the overload protection circuit.

We claim:

1. An overload protection circuit for a thermal transfer device having a fine wire heater element and a temperature sensor, the temperature sensor generating a sensor signal whose amplitude is dependent upon the amplitude of the voltage across the heater element, the temperature sensor being in thermal contact with the heater element, said protection circuit comprising:
   (a) a first differentiator responsive to the amplitude of the sensor signal and producing a differentiated output signal; and
   (b) a second differentiator responsive to the output signal from the first differentiator and producing a twice differentiated output signal; and
   (c) means for actuating an overload signal responsive to the output signal of the first differentiator or second differentiator.

2. The overload protection circuit as in claim 1, wherein an input of the first differentiator is connected to the temperature sensor, thereby being responsive to the amplitude of the voltage across the heater element.

3. The overload protection circuit as in claim 2, wherein the means for actuating an overload signal is responsive to the output signal of the first and second differentiators and the sensor signal.

4. The overload protection circuit as in claim 1, wherein the means for actuating an overload signal comprises a silicon controlled rectifier.

5. The overload protection circuit as in claim 1, further comprising means for filtering out high frequency components from the outputs of the first and second differentiators.

6. The overload protection circuit as in claim 5, wherein the filtering means comprises a capacitance element in series with a switch connected to ground.

7. The overload protection circuit as in claim 6, wherein the switch comprises a field effect transistor.

8. An overload protection circuit for a thermal transfer device having a fine wire heater element and a temperature sensor, the temperature sensor generating a sensor signal whose amplitude is dependent upon the amplitude of the voltage across the heater element, the temperature sensor being in thermal contact with the heater element, said protection circuit comprising:
   (a) a first differentiator responsive to the amplitude of the sensor signal and producing a differentiated output signal;
   (b) a second differentiator responsive to the output signal from the first differentiator and producing a twice differentiated output signal;
   (c) means for summing connected to receive and serve the differentiated output signal from the first differentiator and the twice differentiated output signal from the second differentiator, said summing means producing a sum signal as a result of such summing; and 9. The apparatus of claim 8 wherein the differentiators are each operational amplifiers and the circuit produces the overlaod protection signal in response to either a steep rise in sensor signal amplitude or a steep rate of change in a rise in sensor signal amplitude.

10. The overload protection circuit as in claim 8, wherein an input of the first differentiator is connected to the temperature sensor, thereby being responsive to the amplitude of the voltage across the heater element.

11. The overload protection circuit as in claim 10, further comprising means for actuating an overlaod signal responsive to the output signal of the first and second differentiators and the sensor signal.

12. The overload protection circuit as in claim 11, wherein the means for actuating an overload signal comprises a silicon controlled rectifier.

13. The ovreload protection circuit as in claim 8, further comprising means for filtering out high frequency components from the outputs of the first and second differerentiators.

14. The overload protection circuit as in claim 13, wherein the filtering means comprises a capacitance element in series with a switch connected to ground.

15. The overload protection circuit as in claim 14, wherein the switch comprises a field effect transistor.

* * * * *

UNITED STATES PATENT AND TRADEMARK OFFICE
CERTIFICATE OF CORRECTION

PATENT NO. : 4,733,322
DATED : March 22, 1988
INVENTOR(S) : Jerry Harper & Archie J. Harrison, Jr.

It is certified that error appears in the above-identified patent and that said Letters Patent is hereby corrected as shown below:

Col. 7 (Claim 1), line 47, after "output signal of" insert --either--;

Col. 7 (Claim 1), line 47, after "or" insert --the--.

Col. 8 (Claim 8), line 25, after "signal;" insert --and--;

Col. 8 (Claim 8), line 31, after "summing;" change the semicolon (;) to a period (.) and delete "and".

Signed and Sealed this

Eighteenth Day of October, 1988

*Attest:*

DONALD J. QUIGG

*Attesting Officer*  *Commissioner of Patents and Trademarks*